(12) United States Patent
Shibata et al.

(10) Patent No.: US 12,238,859 B2
(45) Date of Patent: Feb. 25, 2025

(54) WIRING CIRCUIT BOARD

(71) Applicant: NITTO DENKO CORPORATION, Osaka (JP)

(72) Inventors: Shusaku Shibata, Osaka (JP); Teppei Niino, Osaka (JP); Yosuke Nakanishi, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 191 days.

(21) Appl. No.: 18/054,029

(22) Filed: Nov. 9, 2022

(65) Prior Publication Data

US 2023/0147342 A1    May 11, 2023

(30) Foreign Application Priority Data

Nov. 10, 2021    (JP) .................. 2021-183756

(51) Int. Cl.
*H05K 1/02*    (2006.01)
*H05K 1/05*    (2006.01)
*H05K 1/09*    (2006.01)
*H05K 3/24*    (2006.01)
*H05K 3/28*    (2006.01)

(52) U.S. Cl.
CPC ............ *H05K 1/0296* (2013.01); *H05K 1/05* (2013.01); *H05K 1/09* (2013.01); *H05K 3/24* (2013.01); *H05K 3/28* (2013.01)

(58) Field of Classification Search
CPC .......... H05K 1/02; H05K 1/0296; H05K 1/05; H05K 1/09; H05K 3/24; H05K 3/28

USPC ........................................................ 174/250

See application file for complete search history.

(56) References Cited

U.S. PATENT DOCUMENTS

2023/0044364 A1*   2/2023  Bae ..................... H01L 25/0753

FOREIGN PATENT DOCUMENTS

| JP | H10-308397 A | 11/1998 |
|---|---|---|
| JP | H11-233906 A | 8/1999 |
| JP | 2002-231576 A | 8/2002 |
| JP | 2018-137254 A | 8/2018 |

OTHER PUBLICATIONS

Non-Final Office Action which was issued in U.S. Appl. No. 18/054,014 on Jan. 19, 2024.
Final Office Action which was issued in U.S. Appl. No. 18/054,014 on Jul. 15, 2024.

* cited by examiner

*Primary Examiner* — Tremesha W Burns
(74) *Attorney, Agent, or Firm* — Edwards Neils LLC; Jean C. Edwards, Esq.

(57) ABSTRACT

Provided is a wiring circuit board that includes a first insulating layer, a conductive pattern disposed on the first insulating layer, a second insulating layer disposed on the first insulating layer and covering the conductive pattern, and a third protective layer disposed between the conductive pattern and the second insulating layer and protecting the conductive pattern. The third protective layer consists of a metal oxide.

6 Claims, 5 Drawing Sheets

WIRING CIRCUIT BOARD

CROSS-REFERENCE TO RELATED APPLICATION

The present application claims priority from Japanese Patent Application No. 2021-183756 filed on Nov. 10, 2021, the contents of which are hereby incorporated by reference into this application.

BACKGROUND ART

The present invention relates to a wiring circuit board.

There have been proposed circuit boards each including an insulating layer, a conductive circuit disposed on the insulating layer, a cover layer covering the conductive circuit, a chromium thin film and a copper thin film both of which are disposed between the insulating layer and the conductive circuit, and a metal thin film disposed between the cover layer and the conductive circuit (for example, see Patent document 1 below).

CITATION LIST

Patent Document

Patent Document 1: Japanese Unexamined Patent Publication No. H11-233906

SUMMARY OF THE INVENTION

Problem to be Solved by the Invention

In the circuit board as described in Patent Document 1, a metal having magnetism, such as nickel, may be used as the metal thin film. Use of a magnetic metal around the conductive circuit may make it difficult to reduce the transmission loss.

The present invention provides a wiring circuit board that allows the reduction in transmission loss.

Means for Solving the Problem

The present invention [1] includes a wiring circuit board including: a first insulating layer; a conductive pattern disposed on the first insulating layer; a second insulating layer disposed on the first insulating layer and covering the conductive pattern; and a protective layer disposed between the conductive pattern and the second insulating layer and protecting the conductive pattern, wherein the protective layer consists of a metal oxide.

The present invention [2] includes the wiring circuit board described in [1], wherein the protective layer is an insulator and disposed also between the first insulating layer and the second insulating layer.

The present invention [3] includes the wiring circuit board described in [1] or [2], wherein the protective layer contains aluminum.

The present invention [4] includes the wiring circuit board described in any one of [1] to [3], wherein the protective layer contains aluminum oxide.

Effects of the Invention

In the wiring circuit board of the present invention, the protective layer disposed between the conductive pattern and the second insulating layer consists of a metal oxide. Thus, as compared to a case in which the protective layer consists of a magnetic metal, the transmission loss of the conductive pattern can be reduced.

BRIEF DESCRIPTION OF THE DRAWINGS

FIG. 3A to FIG. 3G are explanatory views for explaining a method of producing the wiring circuit board.

DESCRIPTION OF THE EMBODIMENT

1. Wiring Circuit Board

Figure 1:
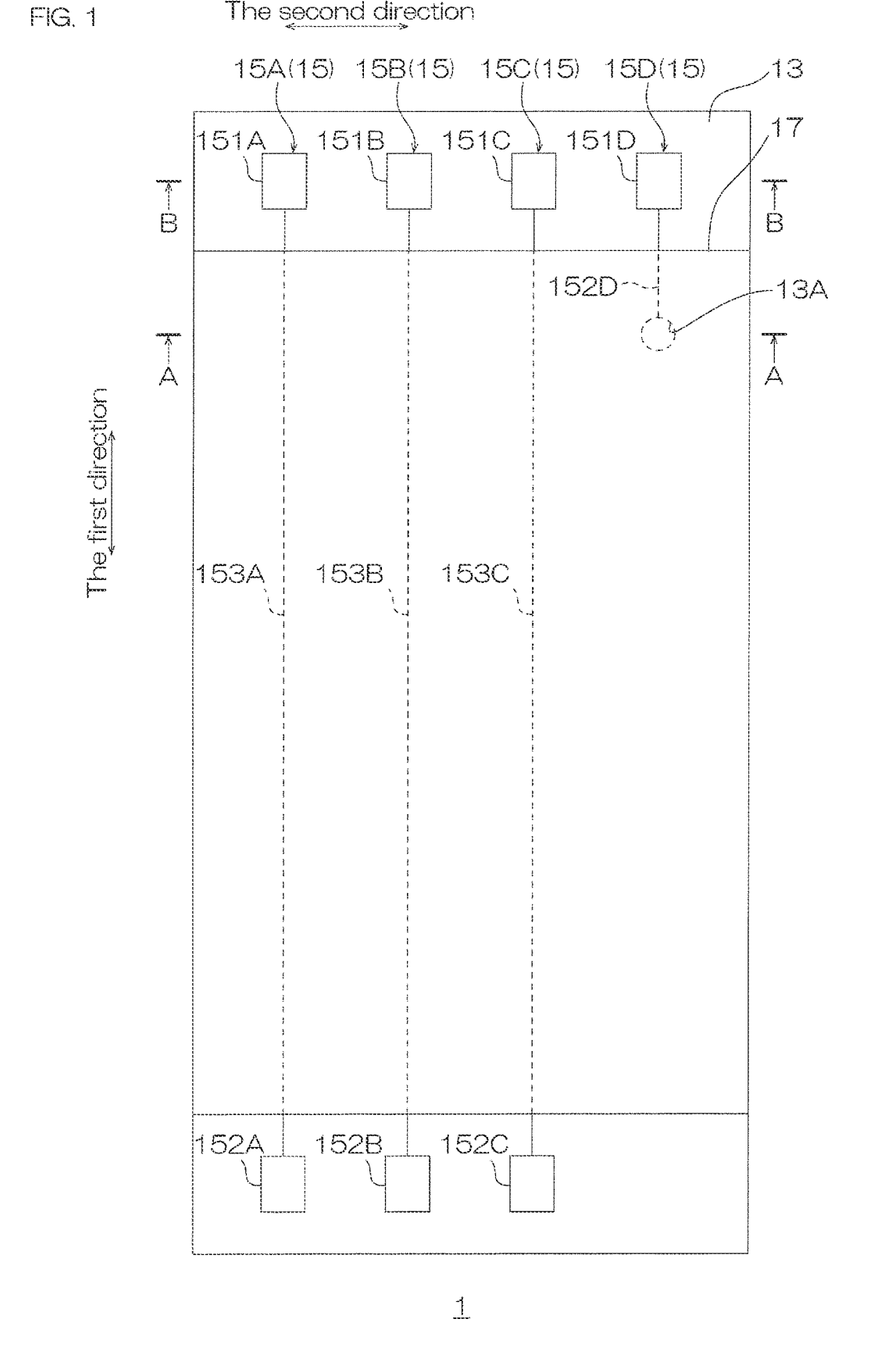
FIG. 1 is a plan view of a wiring circuit board as one embodiment of the present invention.

As shown in FIG. 1, the wiring circuit board 1 extends in a first direction and a second direction. In the present embodiment, a wiring circuit board 1 has an approximately rectangular shape. The shape of the wiring circuit board 1 is not limited.

Figure 2A:
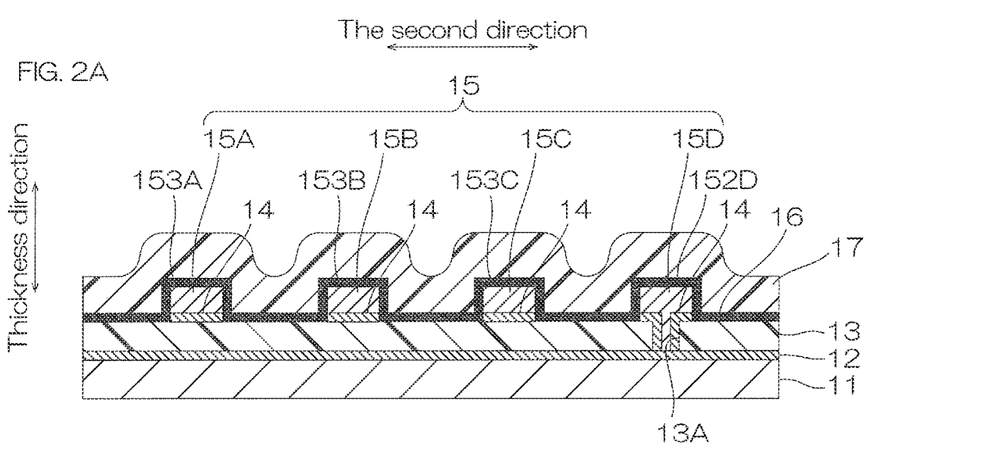
FIG. 2A is a cross-sectional view of the wiring circuit board of FIG. 1, taken along line A-A.
Figure 2B:
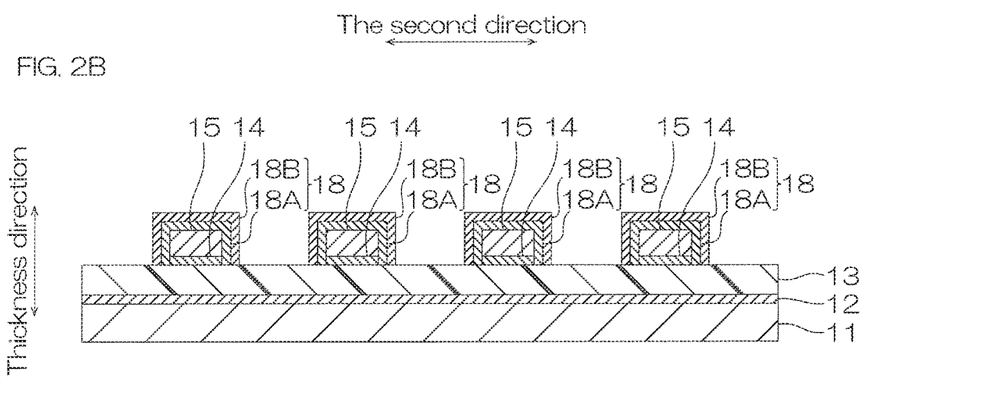
FIG. 2B is a cross-sectional view of the wiring circuit board of FIG. 1, taken along line B-B.

As shown in FIG. 2A and FIG. 2B, the wiring circuit board 1 includes a supporting layer 11, a first protective layer 12, a first insulating layer 13, a second protective layer 14, a conductive pattern 15, a third protective layer 16 as an example of the protective layer, a second insulating layer 17, and a plating layer 18.

(1) Supporting Layer

The supporting layer 11 supports the first protective layer 12, the first insulating layer 13, the second protective layer 14, the conductive pattern 15, the third protective layer 16, and the second insulating layer 17. In the present embodiment, the supporting layer 11 consists of a metal. Examples of the metal include stainless steel and copper alloys.

(2) The First Protective Layer

The first protective layer 12 is disposed on the supporting layer 11 in a thickness direction of the wiring circuit board 1. The thickness direction is orthogonal to the first direction and the second direction. The first protective layer 12 is disposed between the supporting layer 11 and the first insulating layer 13. The first protective layer 12 protects the supporting layer 11. The first protective layer 12 consists of a metal. Examples of the metal include chromium, nickel, titanium, and alloys thereof.

(3) The First Insulating Layer

The first insulating layer 13 is disposed on the first protective layer 12 in the thickness direction. In other words, the first insulating layer 13 is disposed on the supporting layer 11 through the first protective layer 12 in the thickness direction. The first insulating layer 13 is disposed between the supporting layer 11 and the conductive pattern 15. The first insulating layer 13 insulates the first protective layer 12 from the conductive pattern 15. The first insulating layer 13 consists of resin. Examples of the resin include polyimide, maleimide, epoxy resin, polybenzoxazole, and polyester. In the present embodiment, the first insulating layer 13 has a via hole 13A.

(4) The Second Protective Layer

The second protective layer 14 is disposed on the first insulating layer 13 in the thickness direction. The second protective layer 14 is disposed between the conductive pattern 15 and the first insulating layer 13. The second protective layer 14 protects the conductive pattern 15. In detail, the second protective layer 14 is disposed between a wiring pattern 15A and the first insulating layer 13, between a wiring pattern 15B and the first insulating layer 13, between a wiring pattern 15C and the first insulating layer 13, and between a ground pattern 15D and the first insulating layer 13. The wiring patterns 15A, 15B, 15C, and the ground pattern 15D are described below. The second protective layer 14 consists of a metal. Examples of the metal include chromium, nickel, titanium, and alloys thereof.

(5) Conductive Pattern

The conductive pattern 15 is disposed on the second protective layer 14 in the thickness direction. In other words, the conductive pattern 15 is disposed on the first insulating layer 13 through the second protective layer 14 in the thickness direction. The conductive pattern 15 is disposed on an opposite side to the supporting layer 11 with respect to the first insulating layer 13 in the thickness direction. The conductive pattern 15 consists of a metal. Examples of the metal include copper, silver, gold, iron, aluminum, chromium, and alloys thereof. In view of achieving good electrical properties, copper is preferably used. The shape of the conductive pattern 15 is not limited.

In the present embodiment, as shown in FIG. 1, the conductive pattern 15 has the wiring patterns 15A, 15B, and 15C, and the ground pattern 15D. The wiring patterns 15A, 15B, and 15C, and the ground pattern 15D are aligned in the second direction while being separated from each other by an interval therebetween.

(5-1) Wiring Pattern

The wiring pattern 15A has a terminal 151A, a terminal 152A, and a wire 153A. The wiring pattern 15A electrically connects an electronic appliance connected to the terminal 151A and an electronic appliance connected to the terminal 152A.

The terminal 151A is disposed at one end portion of the wiring circuit board 1 in the first direction. The terminal 151A has a square land shape.

The terminal 152A is disposed at the other end portion of the wiring circuit board 1 in the first direction. The terminal 152A has a square land shape.

One end of the wire 153A is connected to the terminal 151A. The other end of the wire 153A is connected to the terminal 152A. The wire 153A electrically connects the terminal 151A and the terminal 152A.

Each of the wiring patterns 15B and 15C is described in the same manner as the wiring pattern 15A. Thus, the description of each of the wiring patterns 15B and 15C is omitted.

(5-2) Ground Pattern

The ground pattern 15D has a ground terminal 151D and a ground wire 152D. The ground pattern 15D connects an electronic appliance connected to the ground terminal 151D with ground through the supporting layer 11.

The ground terminal 151D is disposed at one end portion of the wiring circuit board 1 in the first direction. The ground terminal 151D has a square land shape. The terminals 151A, 151B, and 151C and the ground terminal 151D are aligned in the second direction while being separated from each other by an interval therebetween.

One end of the ground wire 152D is connected to the ground terminal 151D. The other end of the ground wire 152D is connected to the supporting layer 11 through a via hole 13A of the first insulating layer 13 (see FIG. 2). In this manner, the ground wire 152D is electrically connected with the supporting layer 11 through the first protective layer 12.

(6) The Third Protective Layer

As shown in FIG. 2A, the third protective layer 16 covers the conductive pattern 15. The third protective layer 16 is disposed between the conductive pattern 15 and the second insulating layer 17. The third protective layer 16 protects the conductive pattern 15. In detail, the third protective layer 16 covers all the wires 153A, 153B, and 153C, and the ground wire 152D. The third protective layer 16 is disposed between the wire 153A and the second insulating layer 17, between the wire 153B and the second insulating layer 17, between the wire 153C and the second insulating layer 17, and between the ground wire 152D and the second insulating layer 17. The third protective layer 16 protects all the wires 153A, 153B, and 153C, and the ground wire 152D. As shown in FIG. 2B, the third protective layer 16 does not cover the terminals 151A, 151B, and 151C, and the ground terminal 151D. Although not shown, the third protective layer 16 does not cover the terminals 152A, 152B, and 152C, either. In the present embodiment, the third protective layer 16 is an insulator. When the third protective layer 16 is an insulator, the third protective layer 16 may be disposed also between the first insulating layer 13 and the second insulating layer 17.

The third protective layer 16 consists of a metal oxide. The third protective layer 16 does not have magnetism. Examples of the metal oxide of the third protective layer 16 include aluminum oxide, zinc oxide, aluminum silicate, silicon dioxide, and magnesium oxide.

Further, examples of the metal oxide include a metal oxide containing aluminum, silicon, zinc, and inevitable impurities as the metal components, and a metal oxide containing aluminum, gallium, silicon, zinc, and inevitable impurities as the metal components.

The third protective layer 16 preferably contains aluminum. The third protective layer 16 more preferably contains aluminum oxide. As the metal oxide, aluminum oxide and aluminum silicate are preferable.

The ratio of the aluminum in the third protective layer 16 is, for example, 0.5% by mass or more, preferably 0.9% by mass or more. When the ratio of the aluminum in the third protective layer 16 is the lower limit or more, the third protective layer 16 can easily be etched in the method of producing the wiring circuit board 1 described below. The upper limit of the ratio of the aluminum in the third protective layer 16 is not limited. The ratio of the aluminum in the third protective layer 16 is, for example, 60% by mass or less.

The ratio of the aluminum oxide in the third protective layer 16 is, for example, 1% by mass or more, preferably 2% by mass or more. When the ratio of the aluminum oxide in the third protective layer 16 is the lower limit or more, the third protective layer 16 can easily be etched in the method of producing the wiring circuit board 1 described below. The upper limit of the ratio of the aluminum oxide in the third protective layer 16 is not limited. The ratio of the aluminum oxide in the third protective layer 16 is, for example, 100% by mass or less.

The third protective layer 16 has a thickness of, for example, 1 nm or more, preferably 3 nm or more. When the thickness of the third protective layer 16 is the lower limit or more, the wires 153A, 153B, and 153C, and the ground wire 152D are surely protected. The thickness of the third protective layer 16 is, for example, 100 nm or less, preferably 20 nm or less, more preferably 10 nm or less. When the thickness of the third protective layer 16 is the upper limit or less, the third protective layer 16 can easily be etched in the method of producing the wiring circuit board 1 described below.

(7) The Second Insulating Layer

As shown in FIG. 1, the second insulating layer 17 covers all the wires 153A, 153B, and 153C, and the ground wire 152D. In other words, the second insulating layer 17 covers the conductive pattern 15. The second insulating layer 17 is disposed on the first insulating layer 13 in the thickness direction. The second insulating layer 17 does not cover the terminals 151A, 151B, and 151C, and the ground terminal 151D, and the terminals 152A, 152B, and 152C. The second insulating layer 17 consists of resin. Examples of the resin include polyimide, maleimide, epoxy resin, polybenzoxazole, and polyester.

(8) Plating Layer

As shown in FIG. 2B, the plating layer 18 covers the terminals 151A, 151B, and 151C, and the ground terminal 151D. Although not shown, the plating layer 18 also covers the terminals 152A, 152B, and 152C. The plating layer 18 may have a plurality of layers. In the present embodiment, the plating layer 18 includes a first plating layer 18A and a second plating layer 18B.

The first plating layer 18A consists of a metal. Examples of the metal of the first plating layer 18A include nickel and nickel-phosphorus alloys.

The second plating layer 18B consists of a different metal from the first plating layer 18A. Examples of the metal of the second plating layer 18B include gold.

2. Method of Producing Wiring Circuit Board

Next, a method of producing the wiring circuit board 1 is described.

In the present embodiment, the wiring circuit board 1 may be produced by an additive method.

Figure 3A:
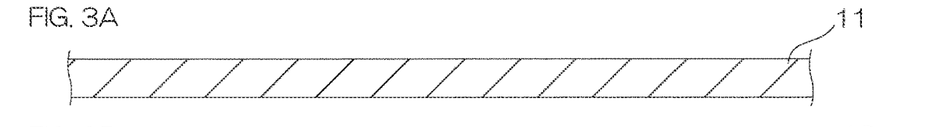
FIG. 3A illustrates a step of preparing a supporting layer.

To produce the wiring circuit board 1, as shown in FIG. 3A, the supporting layer 11 is prepared first. In the present embodiment, the supporting layer 11 is metal foil pulled out of a roll of metal foil.

Figure 3B:
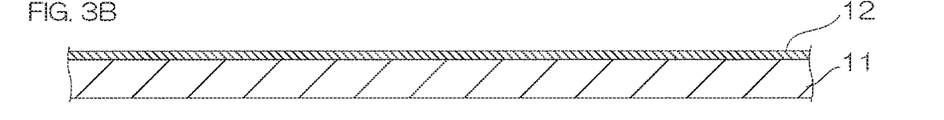
FIG. 3B illustrates a step of forming a first protective layer on the supporting layer.

Next, as shown in FIG. 3B, the first protective layer 12 is formed on the supporting layer 11. The first protective layer 12 is formed, for example, by sputtering.

Figure 3C:
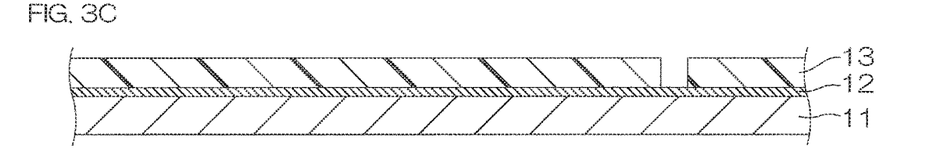
FIG. 3C illustrates a step of forming a first insulating layer on the first protective layer.

Next, as shown in FIG. 3C, the first insulating layer 13 is formed on the first protective layer 12. To form the first insulating layer 13, first, a solution (varnish) of photosensitive resin is applied and dried on the first protective layer 12 to form a film of the photosensitive resin. Next, the photosensitive resin film is exposed and developed. In this manner, the first insulating layer 13 is formed on the first protective layer 12.

Figure 3D:
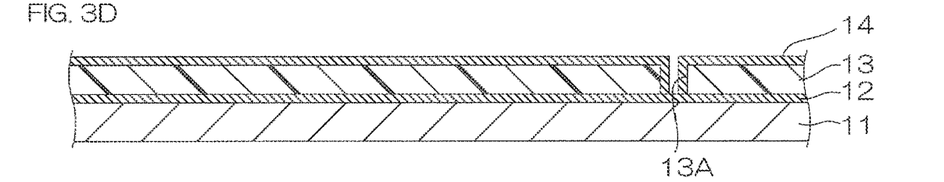
FIG. 3D illustrates a step of forming a second protective layer on the first insulating layer.

Next, as shown in FIG. 3D, the second protective layer 14 is formed on the first insulating layer 13. The second protective layer 14 is formed, for example, by sputtering. The second protective layer 14 is formed also on an inner peripheral surface of the via hole 13A.

Figure 3E:
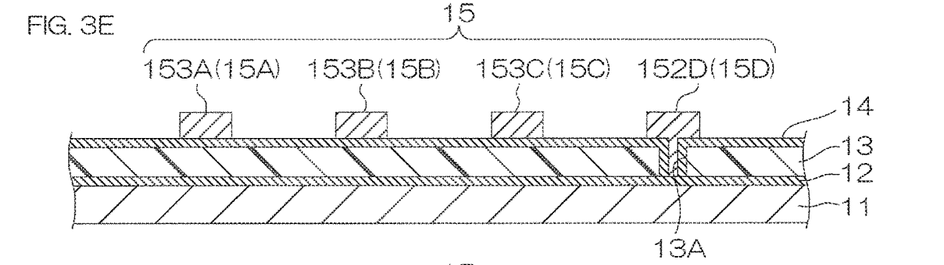
FIG. 3E illustrates a step of forming a conductive pattern on the second protective layer.

Next, as shown in FIG. 3E, the conductive pattern 15 is formed on the second protective layer 14 by electrolytic plating.

In detail, a plating resist is laminated on the second protective layer 14. The plating resist is exposed while the parts on which the conductive pattern 15 is formed are shielded from the light.

Next, the exposed plating resist is developed. This development removes the plating resist of the shielded parts. The second protective layer 14 is exposed at the parts on which the conductive pattern 15 is formed. The plating resist at the exposed parts, i.e., the parts on which the conductive pattern 15 is not formed remains.

Next, the conductive pattern 15 is formed on the exposed second protective layer 14 by electrolytic plating. The conductive pattern 15 fills the via hole 13A. After the completion of the electrolytic plating, the plating resist is released.

Figure 3F:
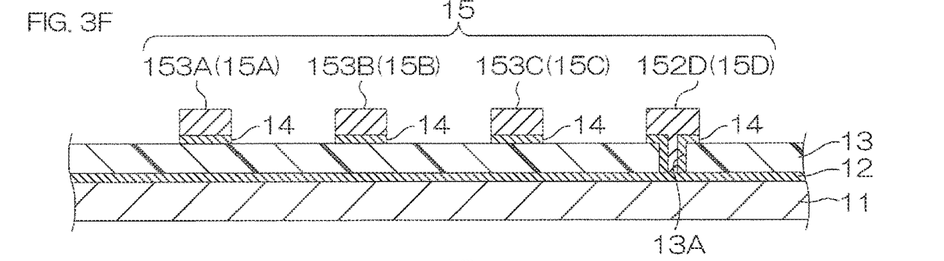
FIG. 3F illustrates a step of removing the second protective layer exposed from the plating resist by etching.

Next, as shown in FIG. 3F, the second protective layer 14 that is exposed by the release of the plating resist is removed by etching with an acid aqueous solution or an alkaline aqueous solution.

Figure 3G:
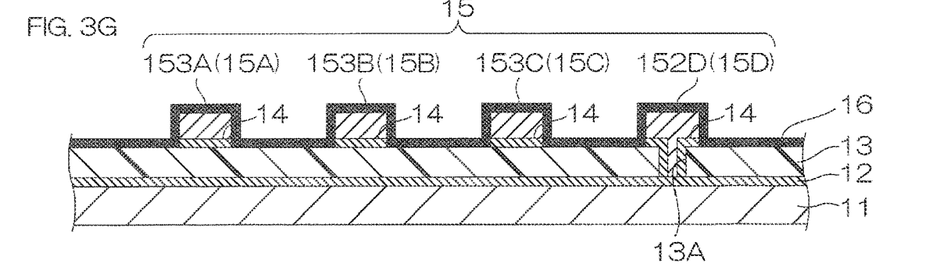
FIG. 3G illustrates a step of forming a third protective layer on the first insulating layer and the conductive pattern.

Next, as shown in FIG. 3G, the third protective layer 16 is formed on the first insulating layer 13 and the conductive pattern 15. The third protective layer 16 is formed, for example, by sputtering.

Next, as shown in FIG. 2A, in the same manner as the formation of the first insulating layer 13, the second insulating layer 17 is formed on the first insulating layer 13 and the conductive pattern 15. As described above, the second insulating layer 17 covers all the wires 153A, 153B, and 153C, and the ground wire 152D and does not cover the terminals 151A, 151B, and 151C, and the ground terminal 151D, and the terminals 152A, 152B, and 152C.

Next, as shown in FIG. 2B, the third protective layer 16 that is not covered with the second insulating layer 17 is removed by etching with an acid aqueous solution or an alkaline aqueous solution. The third protective layer 16 is removed preferably by etching with an acid aqueous solution. In this manner, the third protective layer 16 covering the terminals 151A, 151B, and 151C, and the ground terminal 151D, and the terminals 152A, 152B, and 152C is removed.

Next, the plating layer 18 is formed on the surface of each of the terminals 151A, 151B, and 151C, and the ground terminal 151D, and the terminals 152A, 152B, and 152C by electroless plating or electrolytic plating.

3. Operations and Effects (1) In the wiring circuit board 1, as shown in FIG. 2A, the third protective layer 16 disposed between the conductive pattern 15 and the second insulating layer 17 consists of a metal oxide.

Thus, as compared to a case in which a third protective layer 16 consists of a magnetic metal, the transmission loss of the conductive pattern 15 can be reduced.

(2) In the wiring circuit board 1, as shown in FIG. 2A, the third protective layer 16 is an insulator and disposed also between the first insulating layer 13 and the second insulating layer 17.

When the third protective layer 16 is a semiconductor or conductor, it is necessary to remove the third protective layer 16 between the first insulating layer 13 and the second insulating layer 17 to prevent the electrical short circuit of each of the wiring patterns 15A, 15B, and 15C, and the ground pattern 15D.

To remove the third protective layer 16 between the first insulating layer 13 and the second insulating layer 17, the step of removing the third protective layer 16 between the first insulating layer 13 and the second insulating layer 17 is required at the time after the formation of the third protective layer 16 and before the formation of the second insulating layer 17.

In view of this point, when the third protective layer 16 is an insulator, the removal of the third protective layer 16 between the first insulating layer 13 and the second insulating layer 17 is not required, and thus the production process can be simplified.

4. Variations

Next, variations are described. In each of the variations, the same members as in the above-described embodiment are given the same reference numerals and the detailed descriptions thereof are omitted.

Figure 4:
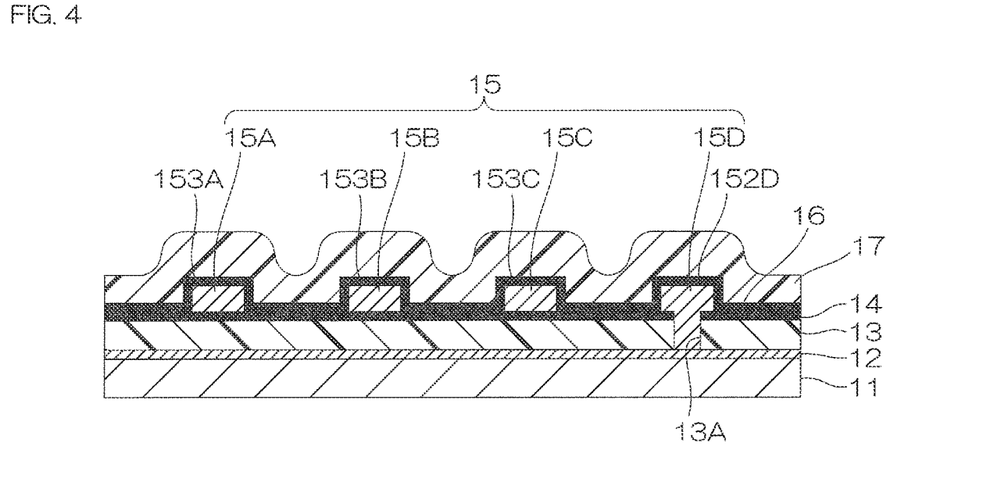
FIG. 4 is an explanatory view for explaining a variation.

(1) As shown in FIG. 4, the second protective layer 14 may also be formed from a metal oxide.

(2) The third protective layer 16 may be a semiconductor or a conductor. When the third protective layer 16 is a semiconductor or a conductor, the third protective layer 16 is not disposed between the first insulating layer 13 and the second insulating layer 17. Examples of the semiconductor or the conductor include alumina-doped zinc oxides.

The aluminum oxide content in the alumina-doped zinc oxide is, for example, 1% by mass or more, preferably 2% by mass or more, and, for example, 10% by mass or less, preferably 5% by mass or less.

The silicon dioxide content in the alumina-doped zinc oxide is, for example, 10% by mass or more, preferably 15% by mass or more, and, for example, 30% by mass or less, preferably 25% by mass or less.

The zinc oxide content in the alumina-doped zinc oxide is, for example, 40% by mass or more, preferably 60% by mass or more, and, for example, 90% by mass or less, preferably 80% by mass or less.

EXAMPLES

Next, the present invention is described with reference to Example and Comparative Example. The present invention is not limited to Examples. The specific numeral values used in the description below, such as physical property values and parameters, can be replaced with the corresponding physical property values and parameters in the above-described "DESCRIPTION OF THE EMBODIMENTS", including the upper limit values (numeral values defined with "or less") or the lower limit values (numeral values defined with "or more").

(1) Production of Wiring Circuit Board (1-1) Example

First, sputtering was carried out, thereby forming a first protective layer (a thickness of 20 nm) consisting of chromium on a supporting layer (a thickness of 100 μm) pulled out of a roll of copper foil (see FIG. 3B).

Next, a solution (varnish) of photosensitive polyamic acid (photosensitive resin) was applied and dried on the first protective layer, thereby forming a film of the photosensitive polyamic acid.

Next, the applied photosensitive polyamic acid film was exposed and developed, thereby forming a first insulating layer (a thickness of 12 μm) consisting of polyimide on the first protective layer (see FIG. 3C).

Next, sputtering was carried out, thereby forming a second protective layer (a thickness of 20 nm) consisting of chromium on the first insulating layer (see FIG. 3D).

Next, a plating resist was laminated on the second protective layer. Then, the plating resist was exposed while the parts on which a conductive pattern was to be formed were shielded from the light.

Next, the exposed plating resist was developed. By that, the plating resist of the shielded parts was removed, and the second protective layer was exposed at the parts on which the conductive pattern was to be formed. The plating resist of the exposed parts, i.e., the parts on which the conductive pattern was not to be formed remained.

Next, the conductive pattern (12 μm) consisting of copper was formed on the exposed second protective layer by electrolytic plating. After the completion of the electrolytic plating, the plating resist was released (see FIG. 3E).

Next, the second protective layer that was exposed by the release of the plating resist was removed by etching with an acid aqueous solution (see FIG. 3F).

Next, a third protective layer (a thickness of 10 nm) consisting of aluminum oxide was formed on the first insulating layer and the conductive pattern by sputtering.

Next, in the same manner as the formation of the first insulating layer, a second insulating layer (a thickness of 5 μm) consisting of polyimide was formed on the first insulating layer and the conductive pattern to cover the wire and expose the terminals (see FIG. 1 and FIG. 2A).

Next, the third protective layer that was not covered with the second insulating layer was removed by etching with an acid aqueous solution. In this manner, the third protective layer covering the terminals was removed.

Next, a first plating layer (a thickness of 200 nm) consisting of nickel and a second plating layer (a thickness of 100 nm) consisting of gold were formed on the surfaces of the terminals by electroless plating (see FIG. 2B).

By the steps as described above, a wiring circuit board was produced.

(1-2) Comparative Example

A wiring circuit board was produced in the same manner as Example except that a third protective layer (a thickness of 20 nm) consisting of nickel instead of the third protective layer consisting of aluminum oxide was formed by electroless plating, and the third protective layer between the wire and the terminal was removed by etching.

(2) Measurement of Transmission Loss

Figure 5:
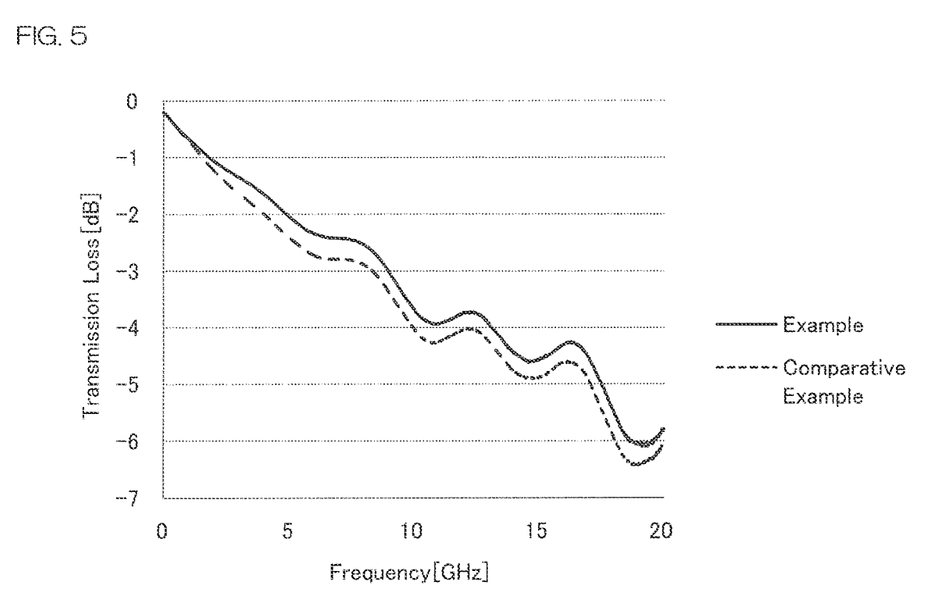
FIG. 5 is a graph showing the transmission loss of the wiring circuit board of each of Example and Comparative Example.

Of each of Example and Comparative Example, the transmission loss of the wiring circuit board was measured using a PNA network analyzer (manufactured by Agilent Technologies). The results are shown in FIG. 5. It is found that Example can reduce the transmission loss better than Comparative Example.

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

The wiring circuit board of the present invention is used, for example, for the electrical connection between electronic appliances.

DESCRIPTION OF REFERENCE NUMERALS

1 wiring circuit board
13 first insulating layer
15 conductive pattern
16 third protective layer
17 second insulating layer

The invention claimed is:

1. A wiring circuit board comprising:
   a first insulating layer;
   a conductive pattern disposed on the first insulating layer, the conductive pattern having a first terminal, a second terminal, and a wire that electrically connects the first terminal and the second terminal;
   a second insulating layer disposed on the first insulating layer and covering the wire without covering at least a part of the first terminal and at least a part of the second terminal; and
   a protective layer disposed between the wire and the second insulating layer and protecting the wire,
   wherein the protective layer consists of a metal oxide.

2. The wiring circuit board according to claim 1, wherein the protective layer is an insulator and disposed also between the first insulating layer and the second insulating layer.

3. The wiring circuit board according to claim 1, wherein the protective layer contains aluminum.

4. The wiring circuit board according to claim 1, wherein the protective layer contains aluminum oxide.

5. The wiring circuit board according to claim 1, wherein the protective layer has a thickness of 100 nm or less.

6. The wiring circuit board according to claim 4, wherein a ratio of the aluminum in the protective layer is 0.5% by mass or more.

\* \* \* \* \*